US011096308B2

(12) United States Patent
Xu et al.

(10) Patent No.: US 11,096,308 B2
(45) Date of Patent: Aug. 17, 2021

(54) PROCESSING ASSEMBLY

(71) Applicants: Inventec (Pudong) Technology Corporation, Shanghai (CN); INVENTEC CORPORATION, Taipei (TW)

(72) Inventors: Ji-Peng Xu, Shanghai (CN); Guang-Zhao Tian, Shanghai (CN); Zhao Geng, Shanghai (CN)

(73) Assignees: INVENTEC (PUDONG) TECHNOLOGY CORPORATION, Shanghai (CN); INVENTEC CORPORATION, Taipei (TW)

( * ) Notice: Subject to any disclaimer, the term of this patent is extended or adjusted under 35 U.S.C. 154(b) by 0 days.

(21) Appl. No.: 16/565,864

(22) Filed: Sep. 10, 2019

(65) Prior Publication Data
US 2021/0068297 A1 Mar. 4, 2021

(30) Foreign Application Priority Data
Aug. 30, 2019 (CN) .......................... 201910814737.X

(51) Int. Cl.
*H05K 7/14* (2006.01)
(52) U.S. Cl.
CPC ......... *H05K 7/1489* (2013.01); *H05K 7/1411* (2013.01); *H05K 7/1415* (2013.01); *H05K 7/1487* (2013.01)
(58) Field of Classification Search
CPC .. H05K 7/1489; H05K 7/1487; H05K 7/1415; H05K 7/1411
See application file for complete search history.

(56) References Cited

U.S. PATENT DOCUMENTS

| | | | | |
|---|---|---|---|---|
| 6,816,368 B2* | 11/2004 | Yokosawa | ............ | G11B 33/126 361/679.33 |
| 7,719,834 B2* | 5/2010 | Miyamoto | .............. | G06F 1/187 361/695 |
| 9,568,959 B1* | 2/2017 | Tian | ........................ | G06F 1/187 |
| 10,349,554 B2* | 7/2019 | Adrian | ................ | G11B 33/142 |
| 10,383,249 B1* | 8/2019 | Peng | .................... | G11B 33/128 |
| 10,558,248 B2* | 2/2020 | Adrian | ................... | G11B 33/10 |
| 10,588,238 B2* | 3/2020 | Kho | ..................... | H05K 7/1487 |

(Continued)

*Primary Examiner* — Adrian S Wilson
*Assistant Examiner* — Theron S Milliser
(74) *Attorney, Agent, or Firm* — Locke Lord LLP; Tim Tingkang Xia, Esq.

(57) ABSTRACT

A processing assembly including cage, partition, two sub-cages, two motherboards, two switch boards and at least one bridge board. Partition is disposed in cage so as to divide inner space of cage into first accommodation space and second accommodation space. Two sub-cages are respectively disposed in first accommodation space and second accommodation space. Two motherboards are respectively disposed on two sub-cages. Two motherboards each include a plate and a plurality of processing units disposed on the plate. Two switch boards are respectively disposed on two sub-cages and respectively electrically connected to two motherboards. Bridge board is electrically connected to two motherboards. One of two motherboards is located between one of two switch boards and bridge board, and another one of two motherboards is located between another one of two switch boards and bridge board.

8 Claims, 6 Drawing Sheets

(56) References Cited

U.S. PATENT DOCUMENTS

| | | | |
|---|---|---|---|
| 10,687,435 B2* | 6/2020 | Adrian | G11B 33/128 |
| 2011/0273850 A1* | 11/2011 | Chen | H05K 5/023 |
| | | | 361/726 |
| 2012/0051010 A1* | 3/2012 | Chen | G06F 1/187 |
| | | | 361/752 |
| 2012/0292928 A1* | 11/2012 | Chang | H05K 7/1489 |
| | | | 292/273 |
| 2014/0078657 A1* | 3/2014 | Xu | G06F 1/189 |
| | | | 361/679.02 |
| 2015/0043146 A1* | 2/2015 | Li | H05K 7/1487 |
| | | | 361/679.31 |
| 2015/0085451 A1* | 3/2015 | Yu | G06F 1/185 |
| | | | 361/747 |
| 2015/0103492 A1* | 4/2015 | Wu | H05K 7/1431 |
| | | | 361/726 |
| 2016/0044820 A1* | 2/2016 | Xu | H05K 7/20727 |
| | | | 361/679.31 |
| 2016/0150667 A1* | 5/2016 | Xu | H05K 7/1487 |
| | | | 361/679.4 |
| 2016/0165742 A1* | 6/2016 | Shen | G06F 1/187 |
| | | | 361/679.37 |
| 2016/0278231 A1* | 9/2016 | Tsai | G11B 33/128 |
| 2017/0202111 A1* | 7/2017 | Huang | H05K 7/20736 |
| 2019/0075677 A1* | 3/2019 | Ehlen | H05K 7/1492 |
| 2019/0104632 A1* | 4/2019 | Nelson | H05K 7/1488 |

* cited by examiner

PROCESSING ASSEMBLY

CROSS-REFERENCE TO RELATED APPLICATIONS

This non-provisional application claims priority under 35 U.S.C. § 119(a) on Patent Application No(s). 201910814737.X filed in China, on Aug. 30, 2019, the entire contents of which are hereby incorporated by reference.

BACKGROUND OF THE INVENTION

Technical Field of the Invention

The invention relates to a processing assembly, more particularly to a processing assembly for a server.

Description of the Related Art

Since the internet becomes widespread, cloud service implemented by the internet and a server is developed rapidly. In general, a processing assembly is included in the server so as to process or transfer the data obtained from the internet into the information that the customers require. In order to provide real time cloud service, the server needs to process the data at high speed, such that more processing units are needed to be disposed in the processing assembly of the server.

SUMMARY OF THE INVENTION

One aspect of this disclosure provides a processing assembly including a cage, a partition, two sub-cages, two motherboards, two switch boards and at least one bridge board. The partition is disposed in the cage so as to divide an inner space of the cage into a first accommodation space and a second accommodation space. The two sub-cages are respectively disposed in the first accommodation space and the second accommodation space. The two motherboards are respectively disposed on the two sub-cages. The two motherboards each include a plate and a plurality of processing units disposed on the plate. The two switch boards are respectively disposed on the two sub-cages and respectively electrically connected to the two motherboards. The at least one bridge board is electrically connected to the two motherboards. One of the two motherboards is located between one of the two switch boards and the at least one bridge board, and another one of the two motherboards is located between another one of the two switch boards and the at least one bridge board.

BRIEF DESCRIPTION OF THE DRAWINGS

The present invention will become more fully understood from the detailed description given hereinbelow and the accompanying drawings which are given by way of illustration only and thus are not limitative of the present invention and wherein.

DETAILED DESCRIPTION

Figure 1:
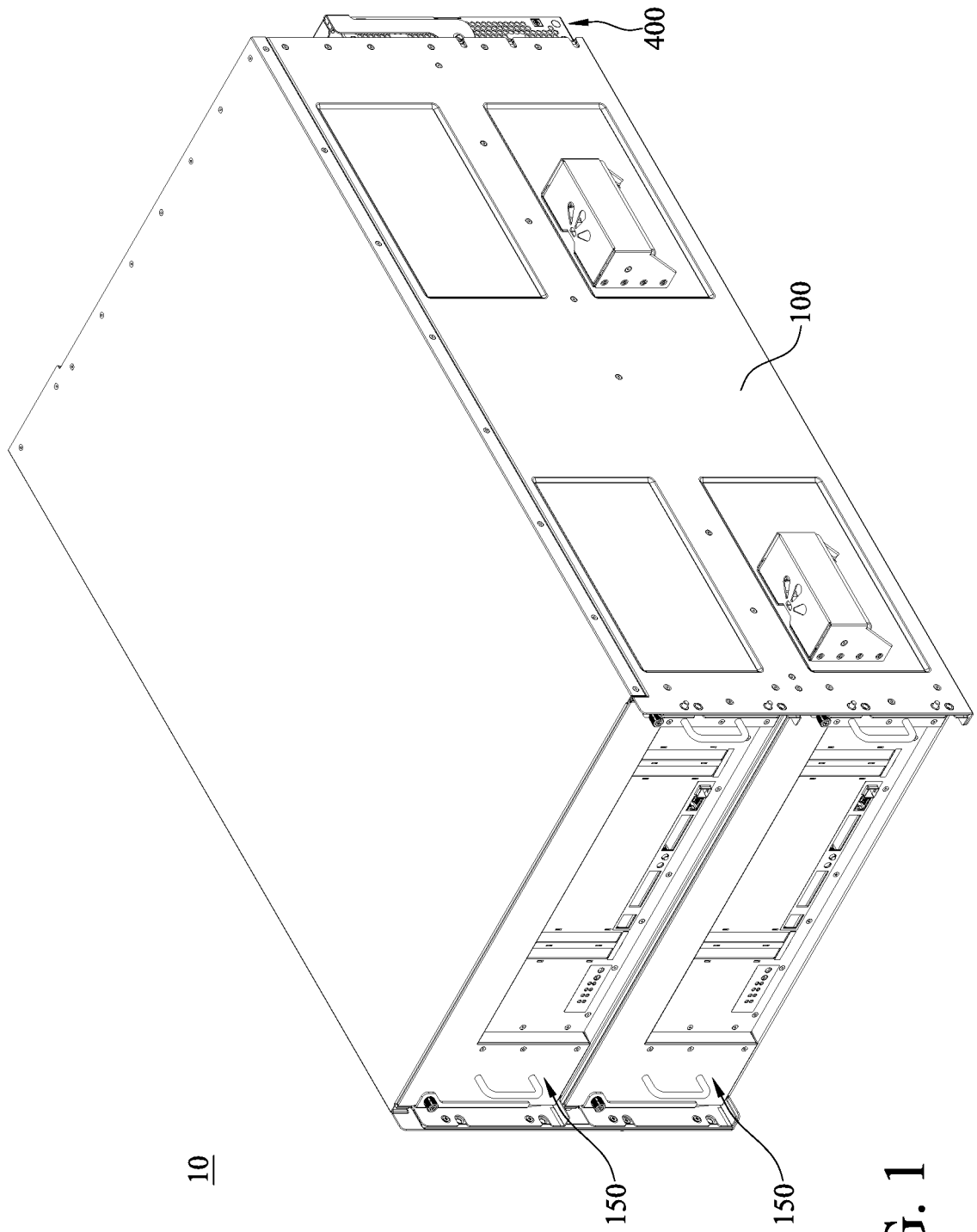
FIG. 1 is a perspective view of a processing assembly according to an embodiment of the invention.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
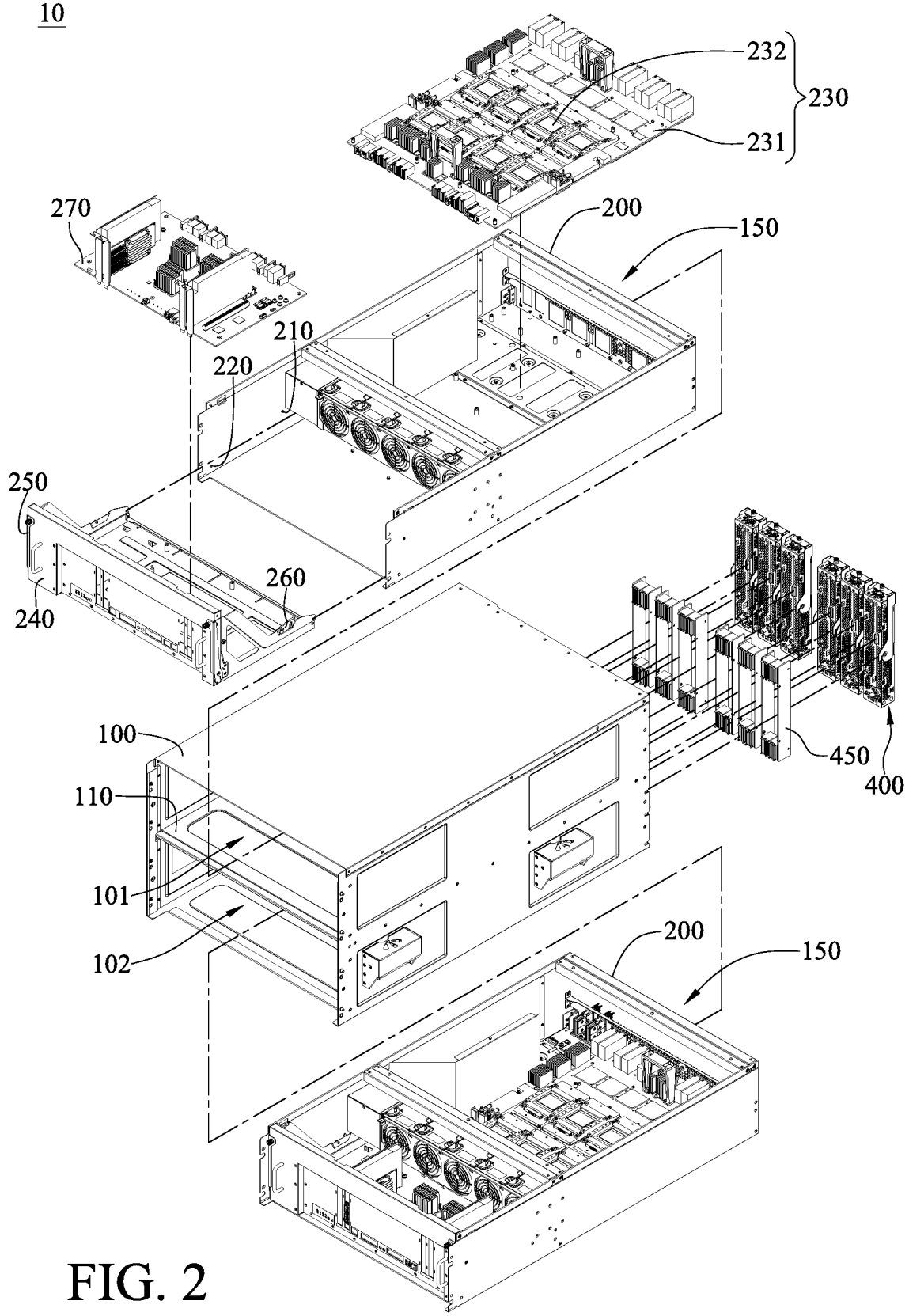
FIG. 2 is an exploded view of the processing assembly in FIG. 1.

Please refer to FIG. 1 and FIG. 2, where FIG. 1 is a perspective view of a processing assembly according to an embodiment of the invention, and FIG. 2 is an exploded view of the processing assembly in FIG. 1.

This embodiment provides a processing assembly 10 including a cage 100, a partition 110, two computing assemblies 150, a plurality of mount components 400 and a plurality of bridge boards 450.

The partition 110 is disposed in the cage 100 so as to divide an inner space of the cage 100 into a first accommodation space 101 and a second accommodation space 102.

Each computing assembly 150 includes a sub-cage 200, two pins 210, two pillars 220, a motherboard 230, a tray 240, two handles 250, two engagement components 260, and a switch board 270.

The two sub-cages 200 of respective computing assemblies 150 are respectively disposed in the first accommodation space 101 and the second accommodation space 102.

It is noted that, since the two computing assemblies 150 are similar in structure, for the purpose of illustration, only the detailed structure of one computing assembly 150 is described hereinafter.

The two pins 210 respectively protrude from opposite sides of the sub-cage 200, and the pins 210 are located in the first accommodation space 101. The two pillars 220 respectively protrude from opposite sides of the sub-cage 200, and the pillars 220 are located in the first accommodation space 101.

The motherboard 230 is disposed on the sub-cage 200. The motherboard 230 includes a plate 231 and a plurality of processing units 232 disposed on the plate 231. In this embodiment, there are eight processing units 232, and the processing units 232 are, for example, graphic processing units (GPU), but the invention is not limited thereto; in other embodiments, the processing units may be central processing units or any suitable type of processing units.

Figure 3:
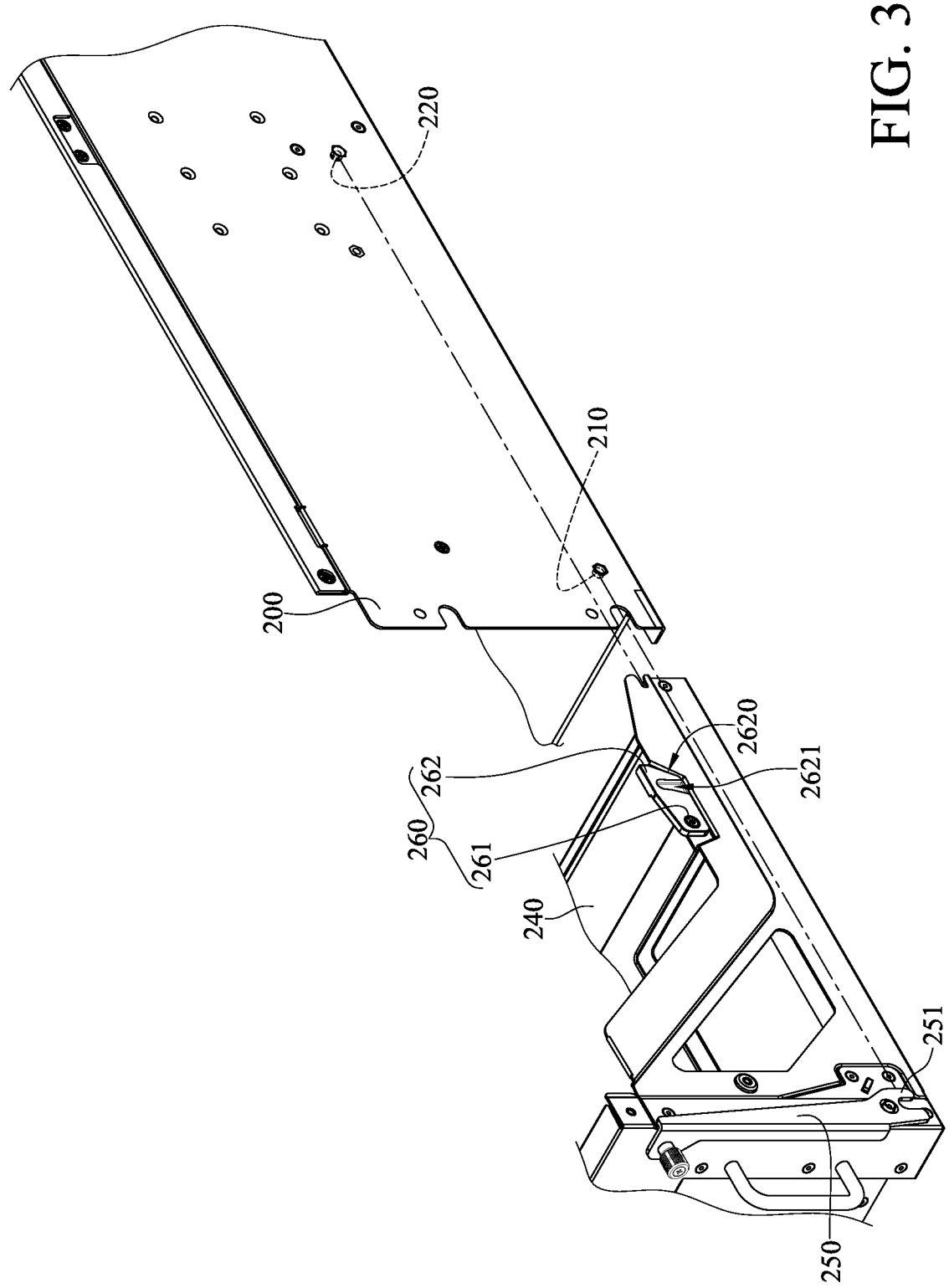
FIG. 3 is an exploded view of a sub-cage and a tray of the processing assembly in FIG. 1.

Please further refer to FIG. 3, where FIG. 3 is an exploded view of a sub-cage and a tray of the processing assembly in FIG. 1. It is noted that, for the purpose of illustration, only one side of the tray 240 and one side of the sub-cage 200 are shown in FIG. 3. The tray 240 is disposed on the sub-cage 200. The two handles 250 are respectively pivotally connected to two ends of a side of the tray 240 located away from the motherboard 230. As shown in FIG. 3, the handle 250 has an engagement structure 251 that is detachably engaged with the pin 210.

The two engagement components 260 are respectively pivotally connected to opposite sides of the tray 240. In this embodiment, each engagement component 260 includes a pivot portion 261 and an engagement part 262 that are connected to each other. In each of the engagement components 260, the pivot portion 261 is pivotally connected to the tray 240, a side of the engagement part 262 that is located away from the pivot portion 261 has a guide surface 2620, and the engagement part 262 has a recess 2621. The two engagement parts 262 are respectively detachably engaged with the two pillars 220 via respective recesses 2621. That is to say, the tray 240 is detachably disposed on the sub-cage 200 via the cooperation of the handles 250 with the pins 210 and the cooperation of the engagement components 260 with the pillars 220.

The operation for installing the tray 240 in the sub-cage 200 is firstly described. When the tray 240 is installed in the sub-cage 200, the pillar 220 presses against the guide surface 2620 of the engagement part 262, such that the engagement part 262 is pivoted relative to the tray 240 via the pivot portion 261, thereby moving the guide surface 2620 away from the tray 240. Next, when the guide surface 2620 does not contact the pillar 220 during the pivoting movement of the engagement part 262, the gravity forces the engagement part 262 to pivot relative to the tray 240 via the pivot portion 261 so that the guide surface 2620 moves toward the tray 240, and thus the pillar 220 is detachably engaged with the recess 2621 of the engagement part 262. In addition, the handle 250 is moved so as to be pivoted relative to the tray 240, such that the engagement structure 251 is detachably engaged with the pin 210.

Next, the operation for detaching the tray 240 from the sub-cage 200 is described. Firstly, the sub-cage 200 is detached from the cage 100 so that the engagement part 262 is exposed outside. Next, the exposed engagement part 262 is moved so that the pillar 220 is detached from the recess 2621 of the engagement part 262. In addition, the handle 250 is pivoted relative to the tray 240, such that the engagement structure 251 is detached from the pin 210. When the pillar 220 is detached from the recess 2621 of the engagement part 262 and the engagement structure 251 is detached from the pin 210, the tray 240 can be removed from the sub-cage 200.

The switch board 270 is disposed on the sub-cage 200 via the tray 240, and is electrically connected to the motherboard 230 via, for example, board-to-board connectors.

Since the engagement part 262 is covered by the cage 100 during the operation of the processing assembly 10, the engagement part 262 only can be moved after detaching the sub-cage 200 from the first accommodation space 101 of the cage 100. In this way, the tray 240 is prevented from unexpected detachment from the sub-cage 200 during the operation of the processing assembly 10, such that the switch board 270 is prevented from disconnection from the motherboard 230, thereby preventing damage on the electronic components in the processing assembly 10.

The tray 240 is an optional component in the present invention. In other embodiments, the computing assembly may not include the tray, and the switch board is fixed to the sub-cage by screwing or other suitable manners.

The present invention is not limited by the quantity of the pillars 220 and that of the engagement components 260, and the multiple pillars 220 and multiple engagement components 260 are optional component in the present invention. In other embodiments, the computing assembly may only include one pillar and one engagement component; in still another embodiment, the computing assembly may not include the pillar and the engagement component.

Moreover, the present invention is not limited by the quantity of the handles 250 and that of the pins 210, and the multiple handles 250 and multiple pins 210 are optional component in the present invention. In other embodiments, the computing assembly may only include one handle and one pin; in still another embodiment, the computing assembly may not include the handle and the pin.

Figure 4:
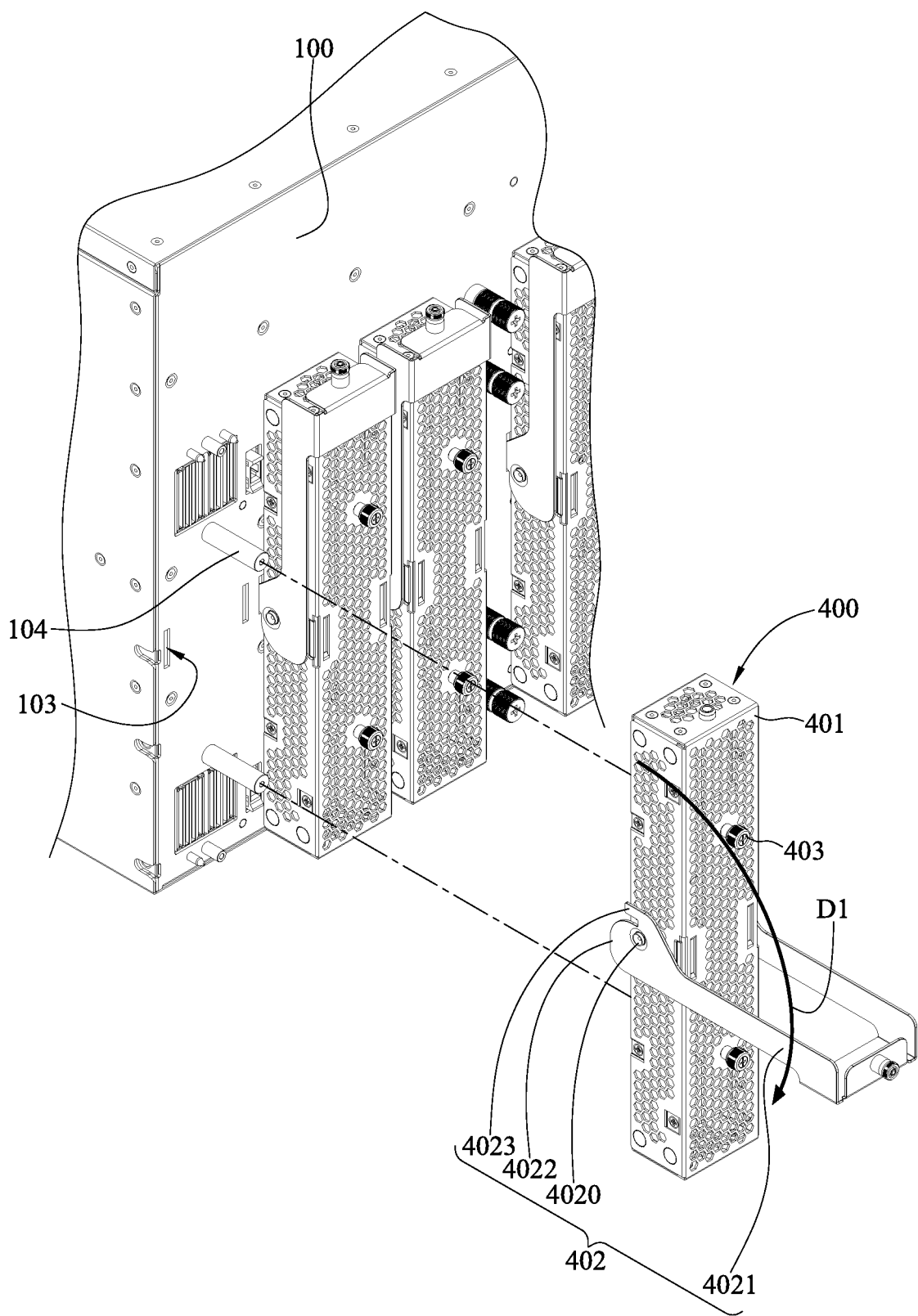
FIG. 4 is a perspective view showing that a bridge board is detached from a cage via a mount component.
Figure 5:
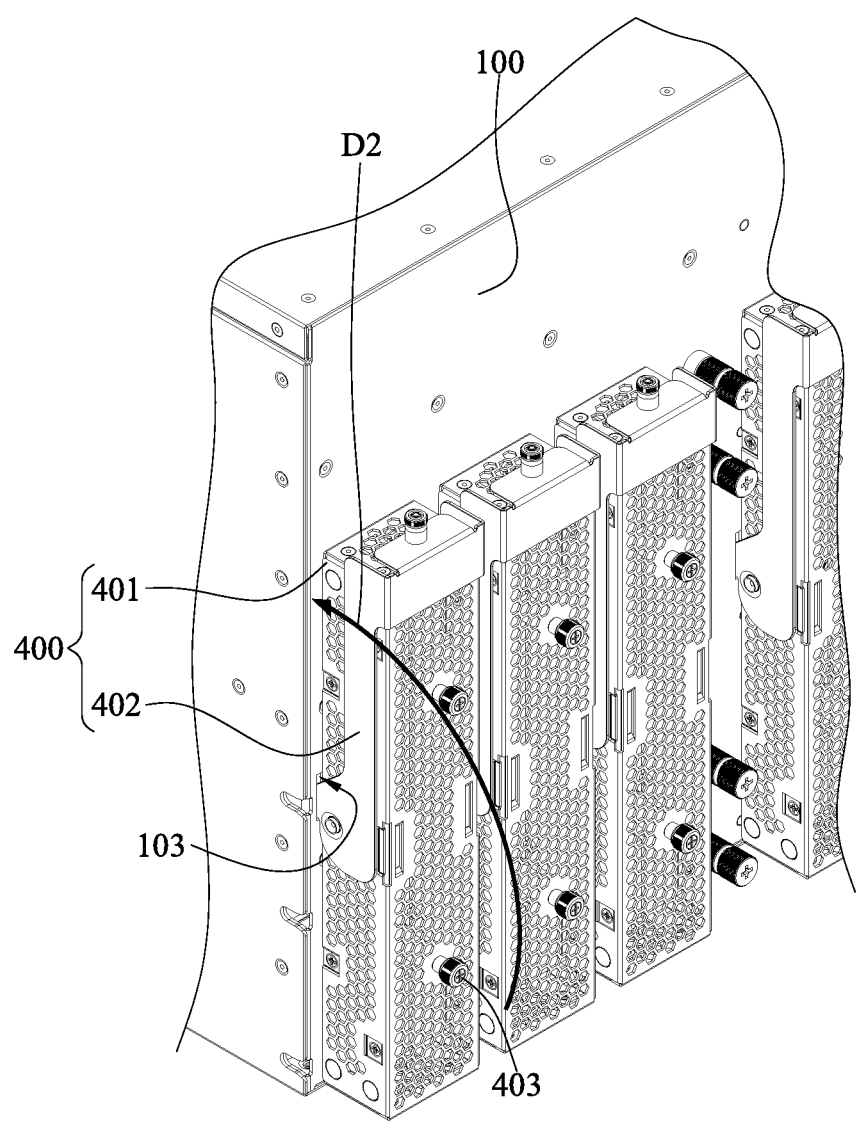
FIG. 5 is a perspective view showing that the bridge board is mounted to the cage via the mount component.

Please refer to FIG. 0.2, FIG. 4 and FIG. 5, where FIG. 4 is a perspective view showing that a bridge board is detached from a cage via a mount component, and FIG. 5 is a perspective view showing that the bridge board is mounted to the cage via the mount component. In addition, since these mount components 400 are similar in structure and the bridge boards 450 are disposed on the cage 100 via respectively mount components 400 in similar manners, for the purpose of illustration, only one mount component 400 and the bridge board 450 disposed therein are described hereinafter.

In this embodiment, the mount component 400 includes a base 401 and a handle 402, and the handle 402 includes two pivot portions 4020, a gripping portion 4021, two pressing portions 4022 and two protrusions 4023. The two pivot portions 4020 are respectively pivotally connected to opposite sides of the base 401 of the mount component 400. The gripping portion 4021 connects the two pivot portions 4020. The two pressing portions 4022 are respectively connected to two sides of respective pivot portions 4020 that are located away from the gripping portion 4021. The two protrusions 4023 respectively protrude from the two pivot portions 4020, and are respectively detachably engaged in the two slots 103 of the cage 100. That is, the base 401 is disposed on the cage 100 via the handle 402.

However, the handle 402 is not limited to be pivotally connected to the base 401, and the invention is not limited by the configuration of the handle 402; in other embodiments, the handle may be fixed to the base. In such embodiments, the handle may only include a fixed part fixed to the base and a gripping portion connected to the fixed part.

In addition, in this embodiment, the processing assembly 10 further includes a plurality of screw pillars 104 and a plurality of thumb screws 403. For example, the base 401 is fixed on the screw pillars 104 protruding from the cage 100 via the thumb screws 403, thereby further preventing the base 401 from moving relative to the cage 100. However, in other embodiments, the processing assembly may not include the screw pillars and the thumb screws.

For example, the bridge board 450 is fixed to the base 401 of the mount component 400 via screws (not labeled), and electrically connects the two motherboards 230 in respective sub-cages 200 via board-to-board connectors. The motherboard 230 is located between the switch board 270 and the bridge board 450.

The operation for electrically disconnecting the two motherboards 230 and the bridge board 450 via the cooperation of the mount component 400 with the cage 100 is firstly described. When the gripping portion 4021 is pulled to pivot the handle 402 relative to the base 401 along a detachment direction D1 via the pivot portion 4020, the pressing portion 4022 presses against the cage 100 so as to help the base 401 to be moved away from the cage 100. When the base 401 is moved away from the cage 100, the bridge board 450 fixed to the base 401 is forced to be moved away from the cage 100, thereby being electrically disconnected from the two motherboards 230.

Next, the operation for electrically connecting the two motherboards 230 and the bridge board 450 via the cooperation of the mount component 400 with the cage 100 is described. When the gripping portion 4021 is pulled to pivot the handle 402 relative to the base 401 along an install direction D2 opposite to the detachment direction D1 via the pivot portion 4020, the protrusion 4023 is engaged in the slot 103 and presses against the cage 100, thereby helping the base 401 to be moved toward the cage 100. When the base 401 is moved toward the cage 100, the bridge board 450 fixed to the base 401 is forced to be moved toward the cage 100, thereby being electrically connected to the two motherboards 230.

However, the present invention is not limited by the quantity of the mount components 400 and the mount components 400 are optional components in the present invention; in other embodiments, the processing assembly may only include one mount component; in still another embodiment, the processing assembly may not include the mount component, and the bridge board may be fixed to the cage by screwing.

Figure 6:
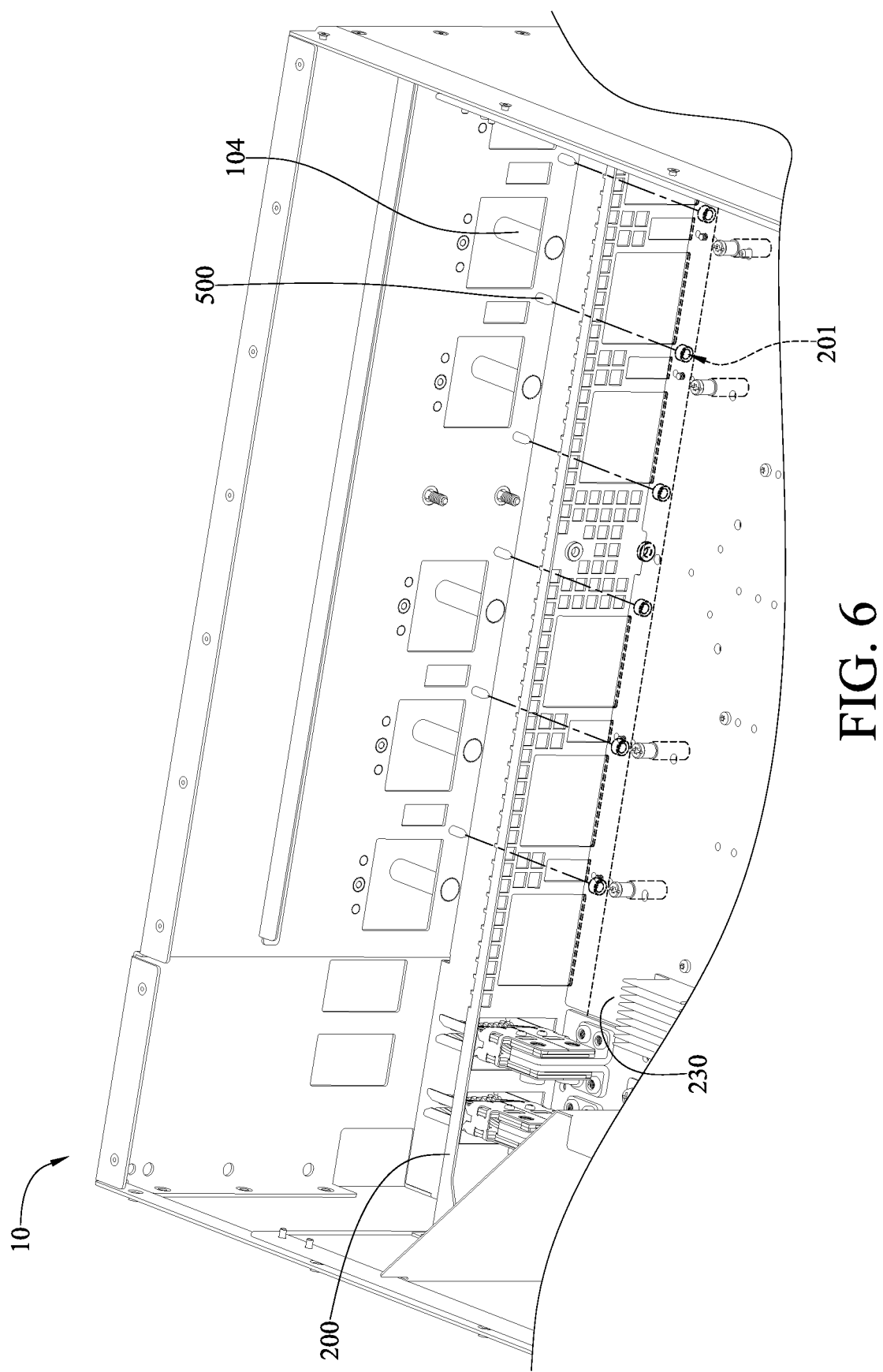
FIG. 6 is an exploded view of the sub-cage and the cage of the processing assembly in FIG. 1.

Please refer to FIG. 2 and FIG. 6, where FIG. 6 is an exploded view of the sub-cage and the cage of the processing assembly in FIG. 1. The processing assembly 10 further includes a plurality of fixed pillars 500. The fixed pillars 500 are respectively disposed on the two sub-cages 200. For the purpose of illustration, only the fixed pillars 500 disposed on one sub-cage 200 are shown in FIG. 6. As shown in FIG. 6, the sub-cage 200 has a plurality of fixing holes 201, and opposite ends of each fixed pillar 500 are respectively fixed to the cage 100 and one of the fixing holes 201 of the sub-cage 200, such that it is favorable for preventing unexpected movement of the sub-cage 200 relative to the cage 100. In addition, the fixed pillars 500 are located between the motherboard 230 and the bridge boards 450.

However, the present invention is not limited by the quantity of the fixed pillars 500, and the plurality of fixed pillars 500 are optional components in the present invention; in other embodiments, the processing assembly may only include two fixed pillars each disposed on the two sub-cages; in still another embodiment, the processing assembly may not include the fixed pillar, and screws may be used to prevent the sub-cages from being moved relative to the cage.

According to the processing assembly discussed above, since two sub-cages are respectively disposed on the first accommodation space and the second accommodation space, one of the motherboards is located between one of the switch boards and the bridge board, and the other motherboard is located between the other switch board and the bridge board, more processing units can be disposed on the two motherboards. In this way, the processing assembly can accommodate more processing units in the limited space of the processing assembly, thereby enhancing the processing speed of the processing assembly.

It will be apparent to those skilled in the art that various modifications and variations can be made to the present disclosure. It is intended that the specification and examples be considered as exemplary embodiments only, with a scope of the invention being indicated by the following claims and their equivalents.

What is claimed is:

1. A processing assembly, comprising:
    a cage;
    a partition, disposed in the cage so as to divide an inner space of the cage into a first accommodation space and a second accommodation space;
    two sub-cages, respectively disposed in the first accommodation space and the second accommodation space;
    two motherboards, respectively disposed on the two sub-cages, the two motherboards each comprising a plate and a plurality of processing units disposed on the plate;
    two switch boards, respectively disposed on the two sub-cages and respectively electrically connected to the two motherboards; and
    at least one bridge board, electrically connected to the two motherboards, one of the two motherboards located between one of the two switch boards and the at least one bridge board, and another one of the two motherboards located between another one of the two switch boards and the at least one bridge board;
    wherein the first accommodation space is located above the second accommodation space and the at least one bridge board is disposed across the first accommodation space and the second accommodation space;
    wherein the processing assembly further comprises two trays, the two trays are respectively disposed on the two sub-cages, and the two switch boards are respectively disposed on the two trays;
    wherein the processing assembly further comprises at least two handles and at least two pins, the at least two handles are pivotally connected to respective sides of the two trays, and the at least two handles are respectively located away from the two motherboards;
    wherein the at least two pins respectively protrude from the two sub-cages and are respectively located in the first accommodation space and the second accommodation space, each of the at least two handles has an engagement structure, and the two engagement structures are respectively detachably engaged with the at least two pins.

2. The processing assembly according to claim 1, further comprising at least two pillars and at least two engagement components, wherein the at least two pillars respectively protrude from the two sub-cages so as to be respectively located in the first accommodation space and the second accommodation space, and the at least two engagement components are respectively pivotally connected to two respective sides of the two trays so as to respectively be detachably engaged with the at least two pillars.

3. The processing assembly according to claim 2, wherein each of the at least two engagement components comprises a pivot portion and an engagement part connected to each other, the two pivot portions are respectively pivotally connected to the two trays,
    in each of the at least two engagement components, a side of the engagement part that is located away from the pivot portion has a guide surface, and the engagement part has a recess,
    when the tray is mounted to the sub-cage, the pillar presses against the guide surface of the engagement part, such that the pivot portion is pivoted relative to the tray, and the engagement part is detachably engaged with the pillar via the recess of the engagement part.

4. The processing assembly according to claim 1, further comprising at least one mount component, the at least one mount component disposed on the cage, and the at least one bridge board disposed on the at least one mount component.

5. The processing assembly according to claim 4, wherein the at least one mount component comprises a base and a handle, the handle is pivotally connected to the base, and the base is disposed on the cage.

6. The processing assembly according to claim 5, wherein the handle comprises a pivot portion, a gripping portion and a pressing portion, the pivot portion is pivotally connected to the base of the mount component, the gripping portion and the pressing portion are respectively connected to opposite sides of the pivot portion, when the gripping portion is pulled to pivot the handle relative to the base along a detachment direction via the pivot portion, the pressing portion presses against the cage so as to help the base to be moved away from the cage.

7. The processing assembly according to claim 6, wherein the handle further comprises a protrusion, and the cage has a slot, the protrusion protrudes from the pivot portion, when the gripping portion is pulled to pivot the handle relative to the base along an install direction that is opposite to the detachment direction via the pivot portion, the protrusion is located in the slot and presses against the cage, thereby helping the base to be moved toward the cage.

8. The processing assembly according to claim 1, further comprising at least two fixed pillar, wherein opposite ends of one of the at least two fixed pillars are respectively disposed on the cage and one of the two sub-cages, one of the at least two fixed pillars is located between one of the two motherboards and the at least one bridge board, opposite ends of another one of the at least two fixed pillars are respectively disposed on the cage and another one of the two sub-cages, and another one of the at least two fixed pillars is located between the another one of the two motherboards and the at least one bridge board.

* * * * *